MINIATURIZED SELF-CONTAINED CIRCUIT MODULES AND METHOD OF FABRICATION

Filed May 6, 1959

INVENTOR
Jack S. Kilby

BY Stevens, Davis, Miller & Mosher
ATTORNEYS

United States Patent Office 3,138,744

Patented June 23, 1964

3,138,744

MINIATURIZED SELF-CONTAINED CIRCUIT MODULES AND METHOD OF FABRICATION

Jack S. Kilby, Dallas, Tex., assignor to Texas Instruments Incorporated, Dallas, Tex., a corporation of Delaware Filed May 6, 1959, Ser. No. 811,486
22 Claims. (Cl. 317—101)

This invention relates to electronic components and to methods for producing miniaturized circuit modules.

In modern day electronic packaging, the need for self-contained modules or "building blocks" which are light and occupy small volumes has become increasingly important. Thus, for example, with the advent of space vehicles, the need for exceedingly light and small electronic devices has become critical, and there has been a continuing search for methods of reducing size, weight, and power consumption of electronic devices. With the advent of the transistor and other semiconductor devices, a major breakthrough was made in the field of circuit miniaturization, and electronic equipment currently employed in air and space craft almost exclusively utilizes semiconductor devices as active operating elements.

As is well known to those familiar with the art of circuit miniaturization, various proposals have been advanced for further minimizing the size of electronic equipment. Such proposals have included the practice of packaging techniques in which an entire electronic "building block" such as a counter, multivibrator, AND gate, OR gate, etc. is formed on a single supporting member, such as an insulating substrate. By the use of conventional methods of applying coatings to the substrate, various passive circuit elements, such as resistors and capacitors, have been formed thereon with a minimum utilization of space.

Although circuit packaging techniques such as those to which reference is made above have obvious advantages, problems have arisen when it has been attempted to employ such techniques in the forming of semiconductor devices, such as diodes and transistors, for conventional semiconductor material, such as germinium or silicon, do not readily lend themselves to evaporation or other methods heretofore employed for the application of passive elements. Consequently, in circuit packages heretofore proposed, it has been conventional to form passive electrical elements upon a substrate and then to connect a separately formed transistor or other semiconductor component to the substrate by solder or conducting cement, thereby to complete the fabrication of the electornic package.

In an effort to further reduce cost and size, and to increase reliability and structural rigidity, the search has continued for a method of producing an electronic packaged assembly in which the necessity for external connection of semiconductor devices would be eliminated. To that end, I have proposed in my pending application for patent, Serial No. 791,602, filed February 6, 1959, that various circuit elements including diodes, transistors, and resistors all be formed within a single block of semiconductor material, thereby eliminating the necessity for separate fabrication of the semiconductor devices and the interconnections as mentioned above. Although my proposal constitutes a major advance in the art of circuit miniaturization, there may arise occasions in which the values of resistance which may be readily formed within bodies of semiconductor material lie outside the bounds of those easily obtained. In addition, since the resistivity of semiconductor material varies quite widely with temperature, there may arise occasions in which a need for resistor stability renders the utilization of circuits embodied in the form of my heretofore-mentioned application less attractive. Consequently, it is an object of this present invention to provide in a package of minimum size, electronic circuits which include not only active elements such as transistors or diodes but, in addition, passive elements of great electrical stability.

Accordingly, in accordance with one feature of the invention, an insulating coating is applied to a block of semiconductor material, and passive electrical elements, such as resistors and capacitors, are formed wholly atop such insulating layer, thus rendering them electrically independent of the semiconductor material.

In accordance with another feature of the invention, the block of semiconductor material is advantageously utilized not only as a support for passive elements which may be formed thereover, but, in addition, as material in which various semiconductor devices may be formed.

In accordance with still another feature of the invention, in embodiments in which both capacitors and resistors are employed, resistive coatings and the lowermost plate of the capacitor may be formed simultaneously, and the dielectric coating for the capaictor may be applied over the resistor areas as well, thereby advantageously exploiting the dielectric material in a dual purpose.

These and other objects and features of the invention will be apparent from the following detailed description, by way of example, with reference to the drawing in which.

Figure 1:
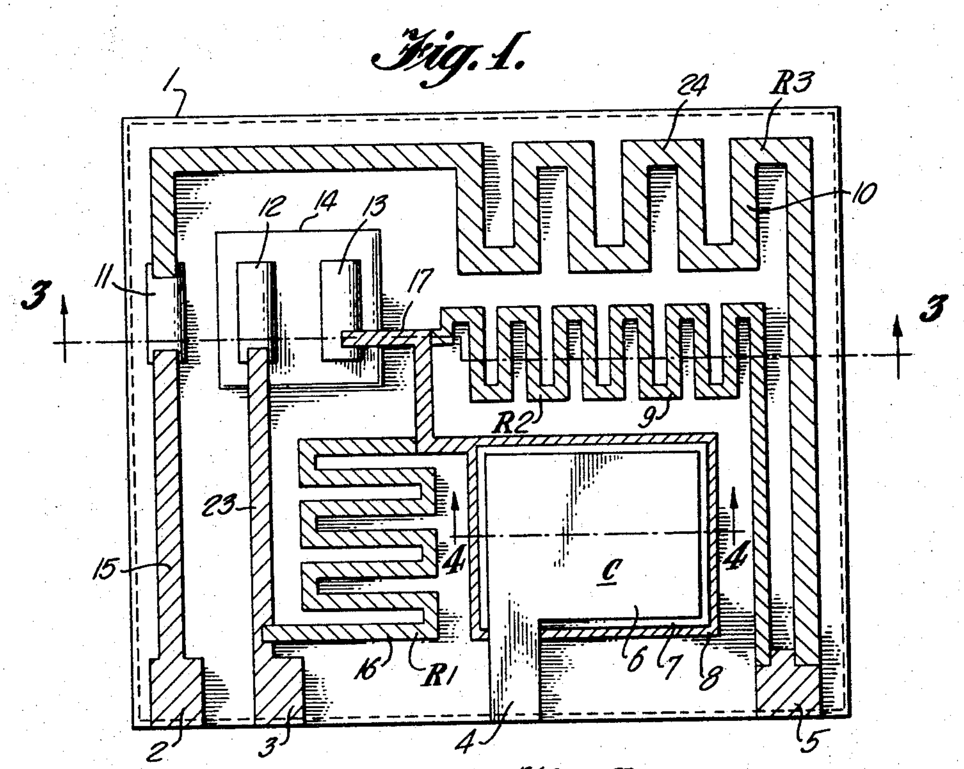
FIGURE 1 is a plan view of one illustrative embodiment of the invention.
Figure 3:
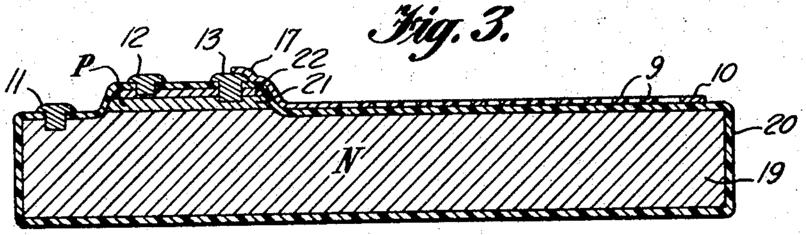
FIGURE 3 is a cross-sectional view taken along the sectional lines 3—3 in FIGURE 1.

Now turning to the drawing, and more particularly to FIGURE 1, it will be noted that therein is shown a hybrid integrated circuit assembly 1 which in the cross section of FIGURE 3 is seen to include a block of semiconductor material 19. Formed within and upon block 19 is a transistor 14, which comprises a portion of block 19 together with layers 21 and 22 which are of conductivity types respectively opposite to and similar to the type of block 19. These two layers 21 and 22 form the base and emitter regions respectively of the transistor, and connections are made to collector, emitter, and base regions by terminals 11, 12, and 13, respectively. It may be noted that the transistor 14 includes a portion of the wafer or block 19 as the collector thereof, this being the portion generally underlying the layer 21. This portion which forms the collector of the transistor might be referred to as a "first" region. The base and emitter of the transistor are provided by the layers 21 and 22 which might be referred to as "second" and "third" regions, respectively. Interconnecting films 15 and 23 of relatively low resistance serve to connect terminals 11 and 12 to external connection tabs 2 and 3; tab 4 provides an external connection to the upper conducting film 6 of capacitor C; and tab 5 provides an external connection to resistive films 9 and 10, which comprise resistors R2 and R3, respectively.

As also noted from an inspection of FIGURE 1, collector 11 of transistor 14 is connected to resistor film 10, and base 13 is connected via relatively low resistance film 17 to relatively high resistance films 16 and 9 which comprise resistors R1 and R2, respectively. Relatively low resistance film 17 also extends in the manner shown to capacitor C, where it is enlarged to form the lower capacitor plate film 8.

Immediately over film 8 is located a dielectric film 7 which may be of any suitable material, such as silicon monoxide; and immediately above film 7 is positioned relatively low resistance film 6, which as heretofore mentioned, comprises the upper conducting film of the capacitor C.

The collector contact 11 might be referred to as at least part of a "first conductive means" for making contact to the collector. Similarly, the base and emitter contacts 13 and 12 might be referred to as "second and third conductive means" in a similar manner. Of course, these designations are purely arbitrary.

Figure 2:
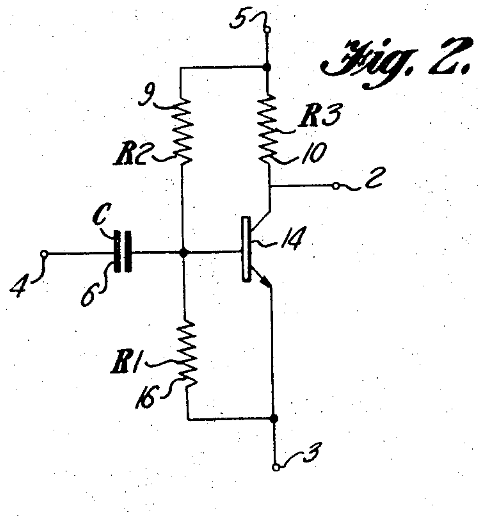
FIGURE 2 is an electrical schematic diagram of the circuits physically embodied in FIGURE 1.

It will now be apparent that the circuit schematically shown in FIGURE 2 is physically embodied within the structure of FIGURE 1. Furthermore, it will be apparent that the embodiment of FIGURE 1 includes active, as well as passive, elements, all formed on a single substrate which, in accordance with this invention, comprises a block of semiconductor material itself.

Although the methods of producing solid state circuits according to my invention may vary somewhat, depending upon the particular embodiment involved, one illustrative method for producing the embodiment of FIGURE 1 is as follows.

Initially, a block of semiconductor material is procured and doped either in its entirety or over an area in which an active circuit element is to be formed. Such doping may be accomplished by any one of several processes, but the one selected for this illustrative description is that of diffusion. Thus, impurities may be diffused in successive layers into the surface of the semiconductor block to form emitter, base, and collector regions.

After doping has been accomplished, upper layer areas other than those required for the active circuit elements may be eliminated by etching, thereby leaving only those desired. Subsequently, the entire remaining block of material may be covered by an insulating coating, ohmic connections made to the several regions of the transistor or other active element, passive elements formed on the surface of the insulating coating, and terminals formed to provide means for making external connections.

Figure 4:
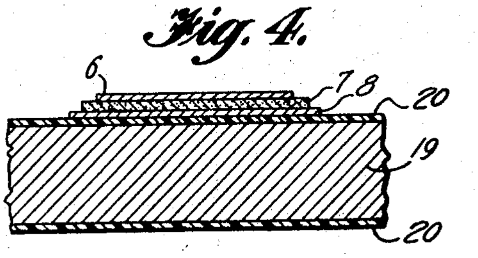
FIGURE 4 is a cross-sectional view taken along the sectional lines 4—4 in FIGURE 1.

Now considering the application of this process to the embodiment of FIGURES 1, 3, and 4, it will be seen that the layers 21 and 22 of transistor 14 extend upwardly from block 19, for this structure contemplates the initial doping of successive layers over the entire surface of the semiconductor block and the etching for removal of the top two layers from all of the block surface except in the relatively small area shown. As is well known in the art, such etching may be accomplished by temporarily coating the semiconductor block with a protective substance in the area desired not to be etched, and then immersing or spraying the block with a suitable etching substance, such as CP–4, described at page 354, vol. I, of Transistor Technology, edited by Bridgers, Scaff, and Shive, published by Van Nostrand Company, New York.

The next step in fabrication of the electronic package consists of coating the entire member with an insulating layer 20. Although the areas particularly desired to be coated are those upon which the heretofore-mentioned resistive and conducting films are to be deposited, the coating has been shown in the figures to cover the entire member, since it may be easier thus to apply it. After the insulating layer has been deposited, small apertures are etched therethrough at the emitter, base, and collector electrodes 12, 13, and 11 in order that connection may be made thereto. These small apertures may be formed in any one of the variety of ways well known in the art. However, one illustrative manner in which this may be accomplished contemplates the coating of the entire top surface of the member 1 with a photo-resist compound which may then be exposed to light through a mask having opaque areas immediately adjacent the areas in which it is desired to form the afore-mentioned apertures. The assembly may then be washed to remove the photo-resist material from those unexposed areas atop the emitter, base, and collector regions, and the assembly may then be brought into contact with an etching solution which is effective to etch through the insulating coating to form recesses of the desired depth. After this has been accomplished, the photo-resist material is removed by immersion in methylene chloride.

Next, the assembly is mechanically masked over its entire surface except where the recesses have been etched, and suitable ohmic-contact-making material is evaporated or otherwise deposited therein. Thus, for example, if an NPN–type transistor is being formed, a mask might be used to cover all of the surface except the emitter and collector recesses, and antimony-doped gold or other suitable material could be evaporated or otherwise deposited through the mask into the recesses. Thereafter, the entire surface of the member 1 could be masked except for the base recess, into which a suitable ohmic-contact-making material such as aluminum might be evaporated or otherwise deposited. After this has been accomplished, the entire assembly is heated to a predetermined temperature at which the deposited material alloys with the base, emitter, and collector to form severally distinct ohmic contacts therewith. Since the principles of alloying ohmic contacts to semiconductor devices are well known in the art, no further description of details thereof will be given here.

After the afore-mentioned ohmic contacts have been made, either the resistive films or the highly conductive films can be next applied. Assuming, for the purposes of this description, that highly conductive films are next applied, a mask is fitted over the surface of the member 1 to expose only those areas shown (in FIGURE 1) with a cross hatch line extending upwardly to the right. These areas comprise those identified with the numerals 15, 23, 17, 2, 3, 5, and the lowermost plate 8 of capacitor C. Next, any suitable highly conductive material, such as copper or gold, is applied by vacuum deposition technique such as that described in the book, Vacuum Deposition of Thin Films, by Holland, published by John Wiley & Sons, New York, 1958. A relatively thick film is applied to the indicated areas in order that the resistance thereof may be made low.

After the low resistance films have been applied, the surface is exposed through a different mask to permit deposition of a relatively thin film of highly resistive materials, such as nichrome, to the areas indicated in FIGURE 1 with cross-hatched lines extending upwardly to the left.

Next, the entire surface may be covered with a material which serves both as a dielectric for capacitor C and as a coating to protect the metal films from oxidation and deterioration. This dielectric film is shown in FIGURE 1 as covering only the area identified with the symbol 7 in order that the figure may be more readily understood. Of course, if it were desired to coat only the area indicated by numeral 7, a mask having a rectangular aperture in the position of rectangle 7 could be employed to prevent deposit other than in this area.

After the dielectric has been deposited, the area indicated by the symbols 4 and 6 is coated with a highly conductive film similar to that employed for film 8, and the capacitor is thereby completed.

Although the embodiment of FIGURE 1 does not include an inductance element, it will be obvious to one skilled in the art that the teachings of my invention, as described above, contemplate the provision thereof. For a detailed explanation of the manner in which one may apply spiral inductances to a flat surface, reference is hereby made to pages 17 and 18 of the booklet entitled, "Printed Circuit Techniques," by Cledo Brunetti and Roger Curtis, National Bureau of Standards Circular 468, issued November 15, 1947.

It will now be seen that the entire member depicted in FIGURES 1, 3, and 4 has been formed in such manner that both active and passive elements are provided in one physically integrated member of extremely small size. Thus, in one actual embodiment according to FIGURE 1, the dimensions in inches were only 0.10 by 0.10 by 0.01.

It will also be apparent that the principles underlying my afore-mentioned pending application could be advantageously combined with the principles embodied in the invention described in this application to produce a structure exhibiting the advantages and features of both thereof. Thus, for example, the active semiconductor elements, the non-critical resistance elements, and the distributed capacitance elements could be formed in the manner described in my pending application, and high stability resistors, capacitors, and inductors formed in the manner described herein. Connections therebetween could be made by etching apertures through the insulating coating at the desired points and the depositing of suitable ohmic-contact-making material to provide connections as described above.

Although the particular illustrative embodiment employed in this specification relates to the physical adaptation of the schematically-depicted circuit shown in FIGURE 2, it will be quite obvious to one skilled in the art that various other types of circuits could be thusly embodied. Various adaptations, variations and modifications could be employed without departing from the spirit and scope of the invention.

What is claimed is:

1. The method of making an electronic device comprising the steps of forming a transistor in a limited-area portion of one face of a wafer of semiconductor material, applying an insulating layer upon said one face of said wafer of semiconductor material and forming upon said layer adjacent said transistor a passive electrical circuit component.

2. The method of making an electronic device comprising the steps of forming a transistor in a limited-area portion of one face of a wafer of semiconductor material, applying an insulating layer upon said one face of said wafer of semiconductor material, and forming upon said layer adjacent said transistor a passive electrical element selected from the class consisting of resistors and capacitors.

3. The method of making an electronic device comprising the steps of forming a PN junction in a wafer of semiconductor material closely adjacent one face thereof with the area occupied by the junction being much less than the total area of said one face, applying an insulating layer upon said one face of the wafer of semiconductor material, and forming upon said layer at a position spaced on said one face from said PN junction a passive electrical circuit component.

4. The method of making an electronic device comprising the steps of forming a PN junction in a wafer of semiconductor material closely adjacent one face thereof with the area occupied by the junction being much less than the total area of said one face, applying an insulating layer upon said one face of said wafer of semiconductor material, and forming upon said one face over said insulating layer spaced from said PN junction a passive electrical element selected from the class consisting of resistors and capacitors.

5. The method of making an electronic device comprising the steps of forming a transistor within one face of a wafer of semiconductor material, removing a portion of said one face from said wafer of semiconductor material to limit the area occupied by said transistor, applying an insulating layer upon said one face of said wafer of semiconductor material and forming upon said insulating layer adjacent said transistor a passive electrical circuit component.

6. The method of making an electronic device comprising the steps of forming a PN junction within one face of a wafer of semiconductor material, removing a portion of said PN junction from said one face of said wafer of semiconductor material, applying an insulating layer upon said one face of said wafer of semiconductor material, and forming upon said insulating layer adjacent said PN junction a passive electrical circuit component.

7. The method of making an electronic device comprising the steps of forming a PN junction within one face of a wafer of semiconductor material, removing a portion of said PN junction from said one face of said wafer of semiconductor material, applying an insulating layer upon said one face of said wafer of semiconductor material, and forming upon said insulating layer adjacent said PN junction a passive electrical element selected from the class consisting of resistors, capacitors, and inductors.

8. The method of making an electronic device comprising the steps of forming a PN junction in a block of semiconductor material, forming in said block of semiconductor material an area of high resistivity immediately adjacent and in ohmic contact with one of the P and N regions in said PN junction, applying an insulating layer upon said block of semiconductor material, forming apertures through said insulating layer at the other one of the P and N regions of said PN junction and at said area of high resistivity, making electrical contacts with said other of the P and N regions of said PN junction and said area of high resistivity through said apertures, and forming upon said insulating layer adjacent said PN junction a passive electrical circuit component.

9. The method defined by claim 8 in which said passive electrical element formed upon said insulating layer adjacent said PN junction comprises a member selected from the class consisting of resistors, capacitors, and inductors.

10. The method of making an electronic device comprising the steps of forming a PN junction in a block of semiconductor material, forming in said block of semiconductor material a capacitor adjacent and in ohmic contact with one of the P and N regions in said PN junction, applying an insulating layer upon said block of semiconductor material, forming apertures through said insulating layer at the other one of the P and N regions of said PN junction and at said capacitor, making electrical contacts through said apertures with said other of the P and N regions of said PN junction and said capacitor, and forming upon said insulating layer adjacent said PN junction a passive electrical circuit component.

11. The method of making an electronic device comprising the steps of forming a PN junction in a block of semiconductor material, forming in said block of semiconductor material an area of high resistivity and an area of distributed capacitance, both said area of high resistivity and said area of distributed capacitance lying adjacent to and in ohmic contact with one of the P and N regions in said PN junction, applying an insulating layer upon said block of semiconductor material, forming apertures through said insulating layer at the other one of the P and N regions of said PN junction, at said area of high resistivity and at said area of distributed capacitance, making electrical contacts through said apertures with said other of the P and N regions of said PN junction, with said area of high resistivity and with said area of distributed capacitance, and forming upon said insulating layer adjacent said PN junction a passive electrical circuit component.

12. The method of making an electronic device comprising the steps of forming a PN junction in a block of semiconductor material, forming in said block of semiconductor material an area of high resistivity and an area of distributed capacitance, both said area of high resistivity and said area of distributed capacitance lying adjacent to and in ohmic contact with one of the P and N regions in said PN junction, applying an insulating layer upon said block of semiconductor material, forming apertures through said insulating layer at the other one of the P and N regions of said PN junction, at said area of high resistivity, and at said area of distributed capacitance, making electrical contacts through said apertures with said other of the P and N regions of said PN junction, said area of high resistivity, and said area of distributed capacitance, and forming upon said insulating layer adjacent said PN junction a passive electrical element selected from the class consisting of resistors, capacitors, and inductors.

13. A semiconductor device comprising a body of single-crystal semiconductor material, a P–N junction being defined in said body adjacent one face thereof by contiguous regions of opposite conductivity types extending to said one face, an insulating layer on said one face overlying said P–N junction and being contiguous thereto, conductive means including a thin elongated strip of re sistive material overlying said insulating layer and being contiguous thereto, said conductive means extending over said P–N junction, one end of said conductive means being electrically connected to one of said regions of said body.

14. A semiconductor device comprising a wafer of single-crystal semiconductor material, a P–N junction being defined in said wafer adjacent one face thereof by contiguous regions of opposite conductivity types extending to said one face, an insulating layer on said one face covering at least a portion of said wafer including said P–N junction and being contiguous thereto, conductive means including a thin elongated strip of resistive material overlying said insulating layer and being contiguous thereto, one end of said conductive means being electrically connected to one of said regions of said wafer, means for applying a bias voltage between the other end of said conductive means and the other of said regions of said wafer, and means including a thin conductive strip adherent to said insulating layer connected to said conductive means closely adjacent said one region for deriving an output from said device.

15. A semiconductor device comprising a wafer of monocrystalline semiconductor material, at least a portion of said wafer adjacent one surface thereof being of one conductivity type, a first region of said wafer of opposite conductivity type contiguous to said portion, a second region of said wafer of said one conductivity type contiguous to said first region and spaced from said portion, an insulating layer covering at least said one surface of said wafer and being contiguous to at least parts of said portion and said first and second regions, a plurality of conductive means contacting each of said portion and first and second regions separately, and a thin elongated layer of resistive material overlying said insulating layer and being contiguous thereto, one end of said elongated layer being connected to one of said conductive means by a conductive strip which overlies said insulating layer.

16. An electronic device comprising a wafer of monocrystalline semiconductor material, at least a portion adjacent one surface of said wafer being of one conductivity type, a first region of said wafer of opposite conductivity type contiguous to said portion, a second region of said wafer of said one conductivity type contiguous to said first region and spaced from said portion, an insulating layer covering at least said one surface of said wafer and being contiguous to at least parts of said portion and said first and second regions, a plurality of conductive means contacting each of said portion and first and second regions separately, and a thin elongated layer of resistive material overlying said insulating layer and contiguous thereto, one end of said elongated layer being electrically connected to one of said conductive means by a conductive strip overlying said insulating layer and being contiguous thereto, one end of said conductive strip contacting said one of said conductive means, the conductive strip extending over said portion and one of said regions.

17. A semiconductor device comprising a body of semiconductor material, a first region of one conductivity type defined in said body, a second region of opposite conductivity type defined in said body contiguous to said first region and adjacent one surface thereof, a third region of said one conductivity type defined in said body contiguous to said second region and spaced from said first region, an insulating layer covering at least said one surface of said body and being contiguous to said first, second, and third regions, first conductive means contacting said first region adjacent said one surface, second conductive means contacting said second region, third conductive means contacting said third region, each of said conductive means being positioned in areas free of said insulating layer, an elongated layer of resistive material overlying said insulating layer and contiguous thereto, one end of said elongated layer being electrically connected to said first conductive means, means for applying a bias voltage between said third conductive means and the other end of said elongated layer and for applying a bias voltage to said second conductive means, and output means connected to said first conductive means.

18. A semiconductor device comprising a wafer of single-crystal semiconductor material, a first region of one conductivity type defined by the major portion of said wafer, a second region of opposite conductivity type defined in said wafer contiguous to said first region and adjacent one surface thereof, a third region of said one conductivity type defined in said wafer contiguous to and overlying said second region and spaced from said first region, an insulating layer covering at least said one surface of said wafer and being contiguous to said first, second, and third regions, first conductive means contacting said first region adjacent said one surface, second conductive means contacting said second region adjacent said one surface, third conductive means contacting said third region adjacent said one surface, each of said conductive means being positioned in areas free of said insulating layer, an elongated layer of resistive material overlying said insulating layer and being contiguous thereto, one end of said elongated layer being electrically connected to said first conductive means, means for applying a bias voltage between said third conductive means and the other end of said elongated layer, means for applying an electrical potential to said second conductive means, and output means connected to said first conductive means and comprising a thin conductive strip adherent to said insulating layer.

19. An electronic device comprising a body of single-crystal semiconductor material, a first region of one conductivity type defined in said body adjacent one surface thereof, a second region of opposite conductivity type defined in said body adjacent said one surface thereof contiguous to said first region, a third region of said one conductivity type defined in said body adjacent said one surface thereof contiguous to said second region and spaced from said first region, an insulating layer overlying said one surface of said body and being contiguous thereto, first conductive means including a first elongated resistive strip positioned on said body overlying said insulating layer and contiguous thereto, one end of said first conductive means being electrically connected to said first region, second conductive means including a second elongated resistive strip positioned on said body overlying said insulating layer and contiguous thereto, one end of said second conductive means being electrically connected to said third region, and capacitive means positioned on said body overlying said insulating layer and electrically connected to said second region.

20. A semiconductor device adapted for amplifying signals and comprising a wafer of single-crystal semiconductor material, a first region of one conductivity type defined in said wafer adjacent one surface thereof, a second region of opposite conductivity type defined in said wafer contiguous to and overlying said first region, a third region of said one conductivity type defined in said wafer contiguous to and overlying said second region and spaced from said first region, an insulating layer overlying said one surface of said wafer and being contiguous thereto, first conductive means adjacent said surface and contacting said first region, second conductive means adjacent said surface and contacting said second region, third conductive means adjacent said surface and contacting said third region, an elongated resistive strip positioned on said wafer overlying said insulating layer and contiguous thereto, one end of said resistive strip being electrically connected to one of said first and third conductive means, capacitive means positioned on said wafer overlying said insulating layer and comprising a pair of conductive layers separated by a dielectric layer, the lower one of said conductive layers being connected to said second conductive means, means for applying signals to the upper one of said conductive layers, means for coupling output signals from said one of said first and third conductive means, and means for applying a bias voltage between the other end of said resistive strip and the other of said first and third conductive means.

21. A semiconductor device comprising a wafer of semiconductor material, a region defined in the wafer adjacent one face thereof composed of semiconductor material of conductivity-type opposite to that immediately underlying such region, an interface between said region and contiguous semiconductor material providing a P–N junction which extends wholly to said one face and there defines an enclosed surface area which is much smaller than the total area of said one face, said region and junction providing at least a part of a semiconductor circuit element, an insulating coating on said one face of the wafer extending across a portion of said junction, an elongated strip of resistive material overlying said insulating coating and being contiguous thereto, and a thin strip of conductive material on said one face overlying said insulating coating, one end of the thin strip of conductive material contacting the resistive strip and the other end extending across said portion of said junction and being electrically connected to said region.

22. An integrated circuit device comprising a wafer of semiconductor material, a semiconductor circuit element adjacent one face of the wafer and including a plurality of surface-adjacent regions of the wafer of opposite conductivity types with P–N junctions between said regions extending to said one face, an insulating coating on said one face of the wafer extending across at least portions of said junctions, a plurality of passive circuit components formed on said one face of the wafer overlying said insulating coating at positions spaced from said regions, said passive circuit components comprising thin deposited layers of material adherent to the insulating coating, and means electrically connecting at least one of said passive circuit components to at least one of said regions comprising thin elongated conductive film on said one face of the wafer overlying and adherent to said insulating coating and extending over said junctions but being insulated therefrom.

References Cited in the file of this patent

UNITED STATES PATENTS

| | | |
|---|---|---|
| 2,446,254 | Van Amstel | Aug. 3, 1948 |
| 2,773,239 | Parker | Dec. 4, 1956 |
| 2,960,754 | Coda et al. | Nov. 22, 1960 |
| 3,029,366 | Lehovec | Apr. 10, 1962 |

FOREIGN PATENTS

| | | |
|---|---|---|
| 64,797 | Denmark | Sept. 2, 1946 |

OTHER REFERENCES

General Electric Transistor Manual, fifth edition, page 39, Figure 5.5.